(12) United States Patent
Krauβ

(10) Patent No.: US 9,100,043 B2
(45) Date of Patent: Aug. 4, 2015

(54) METHOD AND CIRCUIT FOR AN ANALOG DIGITAL CAPACITANCE CONVERTER

(71) Applicant: Mathias Krauβ, Dresden (DE)

(72) Inventor: Mathias Krauβ, Dresden (DE)

( * ) Notice: Subject to any disclaimer, the term of this patent is extended or adjusted under 35 U.S.C. 154(b) by 0 days.

(21) Appl. No.: 14/529,396

(22) Filed: Oct. 31, 2014

(65) Prior Publication Data

US 2015/0130648 A1     May 14, 2015

(30) Foreign Application Priority Data

Oct. 31, 2013 (DE) .......................... 10 2013 222 252

(51) Int. Cl.
| | |
|---|---|
| H03M 1/12 | (2006.01) |
| H03M 1/44 | (2006.01) |
| H03M 1/00 | (2006.01) |
| H03M 1/06 | (2006.01) |
| H03M 1/80 | (2006.01) |

(52) U.S. Cl.
CPC ............... *H03M 1/442* (2013.01); *H03M 1/002* (2013.01); *H03M 1/0624* (2013.01); *H03M 1/00* (2013.01); *H03M 1/12* (2013.01); *H03M 1/804* (2013.01)

(58) Field of Classification Search
CPC .......... H03M 1/00; H03M 1/12; H03M 1/804
USPC ........... 341/156, 155, 172, 170, 118; 327/120
See application file for complete search history.

(56) References Cited

U.S. PATENT DOCUMENTS

| | | | |
|---|---|---|---|
| 4,641,129 A | 2/1987 | Doluca et al. | |
| 5,083,091 A | 1/1992 | Frick et al. | |
| 5,396,131 A | 3/1995 | Miki et al. | |
| 5,990,578 A | 11/1999 | Krauss | |
| 6,509,746 B1 | 1/2003 | Wang | |
| 6,750,796 B1 * | 6/2004 | Holloway et al. | ............. 341/143 |
| 6,970,126 B1 | 11/2005 | O'Dowd et al. | |
| 7,236,113 B1 | 6/2007 | Wang | |
| 7,423,568 B2 | 9/2008 | Hellwig et al. | |
| 2008/0191713 A1 | 8/2008 | Hauer et al. | |

FOREIGN PATENT DOCUMENTS

DE            228132 A1     10/1985

OTHER PUBLICATIONS

H. Matsumoto et al., A Switched-Capacitor Charge-Balancing Analog-to-Digital Converter and Its Application to Capacitance Measurement. IEEE Transactions on Instrumentation and Measurement, vol. 36, No. 4, 873-878, Dec. 1987, 7 pages.
M. Krauss, excerpt of Dissertation B, "Beiträge zur Weiterentwicklung der CMOS Analogschaltkreistechnik", TUDresden, 1985, 3 pages.

* cited by examiner

*Primary Examiner* — Joseph Lauture
(74) *Attorney, Agent, or Firm* — Skaar Ulbrich Macari, P.A.

(57) ABSTRACT

A method for converting a capacitance of a precision capacitor for measurement into a digital signal is described. According to a clocking in charging processes an integration capacitor, discharged before the start of conversion, of an integrator circuit is charged by electric current obtained from a charging of the precision capacitor and in discharge processes by brief current surges in the opposite direction which are obtained from a charging of a reference capacitor, with the result that on average no charge builds up, and the number of discharge processes in a particular number of clock pulses is counted. The clocking is paused after a predetermined number of cycles. A residual voltage is converted into a digital value and the counted number of discharge processes and the particular number of clock pulses are combined with the digital value emitted by the analog-to-digital voltage converter to form a digital total result.

9 Claims, 7 Drawing Sheets

METHOD AND CIRCUIT FOR AN ANALOG DIGITAL CAPACITANCE CONVERTER

PRIORITY

This application claims the benefit of German Patent Application No. 102013222252.1, filed on Oct. 31, 2013.

FIELD

The invention relates to an analogue-to-digital capacitance converter for converting a capacitance of a precision capacitor for measurement into a digital signal, which has: a charge-balancing modulator which comprises: an operational amplifier, between the output and inverting input of which an integration capacitor is switched and the non-inverting input of which is connected to a ground, a reference capacitor, the first electrode of which is connected via a first changeover switch optionally to either a first reference potential or a second reference potential and the second electrode of which is connected via a second changeover switch optionally to either the ground or the inverting input of the operational amplifier, two connections for the precision capacitor, wherein one connection is connected via a third changeover switch optionally to either the first reference potential or the second reference potential and the other connection is connected via a fourth changeover switch optionally to either the ground or the inverting input of the operational amplifier, and a clocked comparator connected at the output of the operational amplifier, as well as a logic gate and a clock generator for controlling the changeover switches and a counting output for emitting a counting signal.

The invention further relates to a method for converting a capacitance of a precision capacitor for measurement into a digital signal, wherein, according to a clocking, in charging processes an integration capacitor, discharged before the start of conversion, of an integrator circuit is charged by an electric current which is obtained from a discharging of the precision capacitor and in discharge processes by brief current surges in the opposite direction which are obtained from a discharging of a reference capacitor, with the result that on average no charge builds up, and the number of discharge processes in a particular number of clock pulses is counted.

BACKGROUND

In sensor technology, capacitive operating principles are being used ever more frequently. Examples of this are, in addition to the conventional field of humidity measurement, fill-level measurement by means of plate capacitor arrangements submerged in the medium, pressure measurement by means of membranes formed as a plate capacitor, or measurement of acceleration and rotation rates with the aid of micromechanical sensors. Advantages are the low power level, the simple design and the virtual freedom from wear.

Various methods are used for measuring capacitance. In modern systems, a digital output signal of the sensor module is fundamentally necessary. The conventional method of using the capacitance as a frequency-determining part of an oscillation-generating circuit to carry out a frequency-to-voltage conversion and then an analogue-to-digital conversion is one possibility. Other methods are based on impedance measurement or the evaluation of capacitive bridge circuits. In the latter method the bridge is stimulated with an alternating voltage and the output voltage after synchronous rectification is amplified and A/D converted. In all of these methods, a—usually very small—signal is converted into a digital signal in several steps. This is expensive, involves many error sources which are an obstacle to high precision requirements and, as a rule, is also slow. The fields of use named further above require ever shorter response times, which go down to the sub-ms range, in the sequence of their enumeration.

A generic converter and generic method which make a direct conversion of the capacitance into a digital signal possible and are very robust and easy to integrate are described in U.S. Pat. No. 5,990,578. The conversion method is based on a charge balance method.

The circuit arrangement in this respect is designed as a so-called charge balancing modulator (or CBM) and has an operational amplifier, between the output and inverting input of which an integration capacitor CI is switched. The non-inverting input of the operational amplifier is connected to a ground, which represents the referene potential. A precision capacitor CS and a reference capacitor CR are further provided. One electrode of the precision capacitor CS is connected via a first changeover switch to either a known reference potential VR or the ground. The other electrode of the precision capacitor is connected by means of a second changeover switch, at the same time as the first changeover switch, to the ground or the inverting input of the operational amplifier. One electrode of the reference capacitor CR is connected via a third changeover switch to either the reference potential VR or ground. The other electrode of the reference capacitor CR is connected by means of a fourth changeover switch, at the same time as the third changeover switch, to the ground or the inverting input.

A clocked comparator is connected at the output of the operational amplifier. The first and the second changeover switches are switched synchronously with the clock signal of a clock generator. The third and the fourth changeover switches are switched synchronously by the output of a gate circuit, wherein a switching signal is emitted when the comparator output signals that a threshold voltage has been exceeded.

In this way, the charge quantity $VR*CS$ is transmitted in every clock pulse to the integration capacitor CI. The charge quantity changes when the threshold voltage of the comparator is exceeded at the output of the operational amplifier, whereby the comparator adopts another switch state at its output. Then, when a clocked pulse occurs, a switching pulse is triggered for the third and fourth changeover switches. As a result, every time that the threshold voltage is exceeded by the integration capacitor CI, a charge quantity $VR*CR$ is additionally subtracted. When the threshold voltage is exceeded, the charge quantity $VR*CS-VR*CR$ is transferred to the integration capacitor in every clock pulse. The output voltage of the operational amplifier thereby falls below the threshold voltage of the comparator, whereby the latter adopts its old state again, and the subtraction of the charge quantity ends. Then, charges $VR*CS$ are again delivered to the integration capacitor CI in every clock pulse until a voltage which lies above the threshold voltage is reached again at the output of the operational amplifier. The process thus repeats itself.

During each discharge of the reference capacitor, a pulse is produced at the gate output. The number z of pulses, relative to the number n of clocked pulses, is a measure of the relationship of the capacitances CS and CR, as $VR*(CS*n)=VR*(CR*z)$. z is thus a digital value for the analogue variable CS. As the method is to be counted among the integrating converter methods (one LSB step per clock period), the conversion time for 14 bit resolution (16,384 steps) in the case of capacitances of a few pF lies in the single-digit ms range, even if the circuit is integrated via modern CMOS processes.

Conversion methods which operate in a similar way are also described in WO 2006/008207 A1 and U.S. Pat. No. 6,970,126. There, a sigma-delta modulator is used instead of the charge-balancing modulator. The difference between these modulators is the return mechanism not present in the case of the sigma-delta modulator. No self-contained conversion of a particular resolution is thereby given; rather a continuous bit stream is emitted, which is converted by a digital filter into a result with a particular bit width and sampling rate. Although a higher sampling rate can thereby be achieved in some cases, when the capacitance changes suddenly the result with the final precision is reached only after several samples. The problem of the response time being too long is not solved by this.

U.S. Pat. No. 7,236,113 and U.S. Pat. No. 6,509,746 deal with correction and diagnosis methods when sigma-delta converters are used for capacitance measurement.

SUMMARY

The object of the invention is to suggest a device and a method for fast conversion of a capacitance into a digital signal, which method and device are in particular robust with respect to the requirements for the tolerances of the circuit components to be integrated and make conversion times in the sub-ms range even in the case of resolutions of >12 bits and capacitances in the double-digit pF range possible.

The object is achieved with a device of the type named at the beginning, which further has:
- a start-stop circuit for short-circuiting the integration capacitor before the start of conversion and for pausing the clock generator after a predetermined number of cycles,
- an analogue-to-digital voltage converter, the input of which is connected to the output of the operational amplifier of the charge-balancing modulator and which is connected to the start-stop circuit such that after the clock generator has been paused the analogue-to-digital voltage converter converts a residual voltage contacting the output of the operational amplifier of the charge-balancing modulator into a digital value and emits it at an output, and
- a counting circuit which is connected to the clock generator, the counting output of the charge-balancing modulator and the output of the analogue-to-digital voltage converter and combines the counting signal delivered by the charge-balancing modulator with the value emitted by the analogue-to-digital voltage converter to form a total result, wherein the counting circuit defines low-order bits of the total result on the basis of the value emitted by the analogue-to-digital voltage converter and high-order bits of the total result on the basis of the counting signal.

The object is further achieved with a method of the type named at the beginning, in which
- the clocking is paused after a predetermined number of cycles,
- a voltage which the integrator circuit emits on the basis of a residual charge of the integration capacitor is converted into a digital value by means of analogue-to-digital voltage conversion and
- the counted number of discharge processes and the particular number of clock pulses are combined with the digital value emitted by the analogue-to-digital voltage converter to form a digital total result, wherein low-order bits of the total result are defined on the basis of the digital value emitted by the analogue-to-digital voltage converter and high-order bits of the total result are defined on the basis of the counted number of discharge processes and the particular number of clock pulses.

Counting circuit and/or start-stop circuit can be implemented by a microcontroller.

The invention develops the charge balance method by dividing the method into two phases. In a phase 1, according to the charge balance method a pulse sequence is produced, the number of pulses $Z1$ of which, measured over a particular period of time, has a relationship to the number $N1$ of clocked pulses supplied in the same period of time, which relationship corresponds to the relationship of sensor capacitance $CS1$ to the reference capacitance $CR1$ (provided that both capacitances are charged or discharged at the same voltage $VR1$) (the following explanation of the essence of the invention, for the sake of simpler representation, only discusses the first reference potential and sets the second reference potential to be equal to the ground).

$$N1*CS1*VR1-Z1*CR1*VR1=0$$

$$Z1/N1=CS1/CR1.$$

As the number $N1$ of supplied clocked pulses and the reference capacitance $CR1$ are known, $Z1$ is a digital measure of the sensor capacitance:

$$CS1=Z1*CR1/N1.$$

The charge balance is controlled in a regulation loop such that the charge supplied to the integration capacitor by the unknown capacitance $CS1$ of the precision capacitor with each of the $N1$ clock pulses is, on average, in balance with the charge discharged by the known capacitance $CR1$ of the reference capacitor in the $Z1$ clock pulses controlled by the comparator. As the conversion was started according to the invention by returning the integrator to the start with a defined charge balance of zero, at the end of the conversion a charge value of the variable that, as a rule, differs from zero $$Q1=N1*CS1*VR1-Z1*CR1*VR1$$

remains on the integration capacitor. This fact is an expression of a quantization error of the conversion, the amount of which is always smaller than 1 LSB of the digital representation of $CS1$, but can be both positive and negative. The longer the conversion lasts, or the greater $N1$ is, the more precisely $Z1/N1$ represents the capacitance ratio $CS1/CR1$ (or $Z1$ the capacitance $CS1$). In order to keep the residual error smaller than 1 LSB in the case of a 14 bit wide digital representation, $2^{14}$ clock pulses are needed. Due to the required settling of the switched capacitor circuit necessary in each individual clock cycle, the clock frequency is limited to a few MHz in particular in the case of higher values of the sensor capacitance, whereby relatively long conversion times result. The essence of the invention is now to limit the conversion time in phase 1 to an amount which satisfies the requirements of the application, and to digitize the information contained in the residual charge in a phase 2. A total result of comparable precision is thus obtained in a much shorter time. According to the invention, the clocked conversion of phase 1 is stopped, with the result that there is a voltage proportional to the residual charge (relative to the ground)

$$VA1=Q1/CI1$$

at the output of the integrator. By pausing the clock pulse, the converter of phase 1 acts as a hold element in phase 2.

Phase 2 deals with detecting the voltage VA1—which is carried out by an A/D converter. The conversion result of phase 2 represents the low-order bits of the total result, while the binary representation of the conversion result of phase 1 provides the high-order bits. The total resolution of the converter results as the sum of the bit resolution of phase 1 and the resolution of phase 2 reduced by a factor of 2 or 1 bits; the conversion time results as the sum of the conversion times of phase 1 and 2.

The conversion in phase 1 is carried out according to the charge-balance method. A different or the same conversion method can be used for phase 2. The combination of both phases 1 and 2, i.e. the only partial conversion of the capacitance value with the charge-balance converter (also called charge-balance modulator=CBM) combined with the conversion of the residual voltage by an analogue-to-digital voltage converter (ADC), achieves a significant acceleration of the measurement with a circuit for which the design complexity is not substantially increased compared with the state of the art. This is true particularly when the ADC also operates according to the charge balance method.

An example is to illustrate this. If a total resolution of 14 bits is to be implemented, the resolution of the CBM (phase 1) can be configured for example for 8 bits and that of the ADC (phase 2) for 7 bits. Thus, 256 clock pulses are necessary for the CBM and, depending on the conversion method, for the ADC only 1 clock pulse is necessary in the case of a Flash converter or up to 128 clock pulses in the case of a counting method. Thus, the total number of clock pulses needed, depending on the implementation, lies in the range of from 257 to 384 clock pulses for a 14 bit conversion. A much shorter conversion time thus results compared with the number of clock pulses, of 16384, needed in the case of the pure charge balance method.

An advantageous implementation of the ADC results if the latter is likewise designed as a charge balance converter in switched-capacitor technology.

The total resolution of the conversion results from the combination of the resolutions of phase 1 and phase 2. In order to keep the advantages of the charge balance method in respect of noise immunity as undiminished as possible, it is preferred to distribute the resolutions such that the charge balance method of phase 1 reproduces at least the upper half of the bits of the resolution. The charge balancing modulator thus stops after a predetermined number of cycles which corresponds to a resolution of k bits. The subsequent analogue-to-digital voltage converter converts the residual voltage into a digital value which has m bits. The digital total result thus has a resolution of $p=k+(m-1)$ bits. In the preferred embodiment, k is greater than or equal to $0.5*p$.

The two-phase procedure can be boosted again in respect of the sampling rate if phase 1 and phase 2 are carried out simultaneously. While the analogue-to-digital voltage converter is converting the residual voltage in phase 2, the charge-balancing modulator can already start a new conversion when the residual voltage from phase 1 is suitably buffered and then made available to the analogue-to-digital voltage converter. For this embodiment it is preferred that the combination of operational amplifier, integration capacitor and return switch is provided twice and alternated between these, with the result that one combination always buffers VA1 while the other integrates. The speed advantage is particularly great if charge-balancing modulator and A/D converter have similar conversion times.

Surprisingly, even in the case of continuous conversion by means of charge balance methods, a significant acceleration can be achieved by carrying out not only phase 1 after the charge balance method, but also phase 2. The analogue-to-digital capacitance converter in this embodiment is formed to the effect that the analogue-to-digital voltage converter has an operational amplifier, between the output and inverting input of which an integration capacitor is switched and the non-inverting input of which is connected to the ground, a reference capacitor, one electrode of which is connected via a first changeover switch optionally to either a further first reference potential or the ground and the other electrode of which is connected via a second changeover switch optionally to either the ground or the inverting input of the operational amplifier, an input capacitor, one electrode of which is connected via a third changeover switch optionally to either the potential of the residual voltage or the ground and the other electrode of which is connected via a fourth changeover switch optionally to either the ground or the inverting input of the operational amplifier, and a comparator connected at the output of the operational amplifier, as well as a logic gate and a clock generator for controlling the changeover switches, and that the counting circuit for determining the digital value emitted by the analogue-to-digital voltage converter counts the pulses delivered by the logic gate of the analogue-to-digital voltage converter and forms the digital value emitted by the analogue-to-digital voltage converter on the basis of the counted pulses.

In the explanation until now the second reference potential $VR1b$ has been assumed to be identical to the ground. This is possible. However, a second reference potential wherein the ground lies between the first ($VR1a$) and the second ($VR1b$) reference potential is preferred. The voltage VR1 of the above description is then to be replaced with $VR1a-VR1b$. This applies in principle in the case of a change between embodiments with first and second reference potential and embodiments in which the second reference potential is identical to the ground.

The residual voltage can have positive or negative polarity depending on the state at which phase 1 is ended. For a particularly quick conversion therefore a design is preferred in which phase 2 also carries out a conversion according to the charge balance method, wherein the analogue-to-digital voltage converter has an additional capacitor, one electrode of which is connected via a fifth changeover switch optionally to either a further second reference potential or a further second reference potential and the other electrode of which is connected via a sixth changeover switch optionally to either the ground or the inverting input of the operational amplifier, wherein the clock generator also controls the fifth and sixth changeover switches.

In the design with phase 2 according to charge balance conversion, it is necessary to adapt the input range of the analogue-to-digital voltage converter, which then likewise operates according to the charge balance method, as precisely as possible to the value to be expected of the residual voltage. This is achieved in a preferred embodiment in that the same reference potentials (reference voltages if based on the ground) are used in both converters and in that $CR1=CSmax$, $CI1>2*CR1$, $CZ2=0.5*CR2$ and $CE2=0.5*CI1*CR2/CR1$, wherein CSmax is the maximum allowable capacitance of the precision capacitor for measurement, CR1 is the capacitance of the reference capacitor of the charge-balancing modulator, CI1 is the capacitance of the integration capacitor of the charge-balancing modulator, CE2 is the capacitance of the input capacitor of the analogue-to-digital voltage converter, CR2 is the capacitance of the reference capacitor of the analogue-to-digital voltage converter and CZ2 is the capacitance of the additional capacitor of the analogue-to-digital voltage converter.

A particular security against overload is achieved if additionally $CI2>2*CR2$ also applies, wherein CI2 is the capacitance of the integration capacitor of the analogue-to-digital voltage converter.

No increased requirement is made on the ground, but a prerequisite for the above-mentioned dimensioning of the capacitances is that the same ground is used in both phases. The exact values of the reference potentials are not included in the result. The same reference potentials can therefore be used for the conversion in both phases. In respect of technical realisation, it is particularly advantageous to use the higher and lower supply voltage (e.g. +5 V and 0 V or +2.5 V or −2.5 V) of the circuit as first and second reference potential. The ground lies between these voltages.

All changeover switches can also be called three-way switches.

BRIEF DESCRIPTION OF THE FIGURES

It is understood that the features mentioned above and those yet to be explained below can be used not only in the stated combinations but also in other combinations or alone, without departing from the scope of the present invention.

The invention is explained in more detail below by way of example with the help of the attached drawings, which also disclose features essential to the invention. There are shown in.

DETAILED DESCRIPTION

Figure 1:
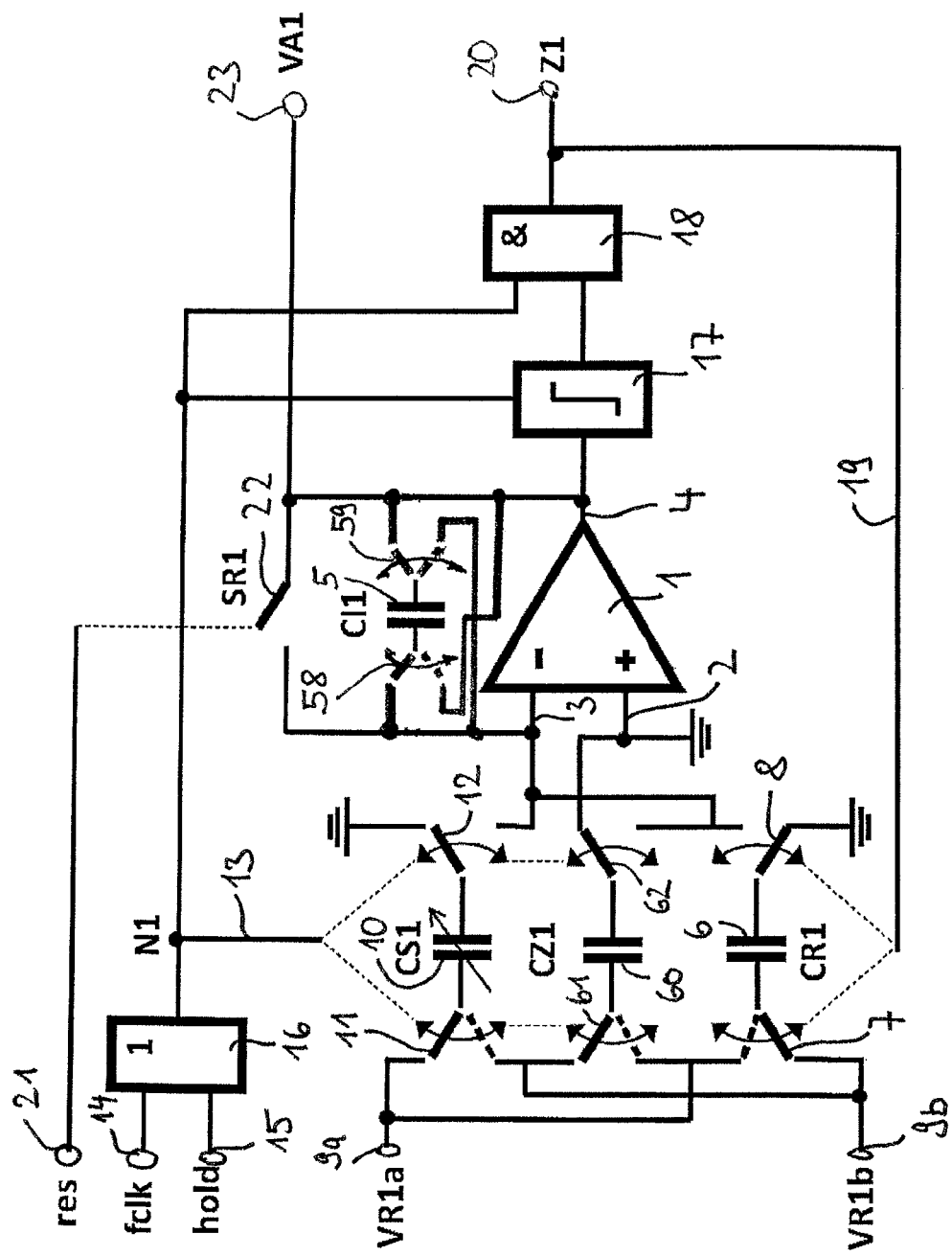
FIG. 1 a charge-balancing modulator for converting a capacitance of a precision capacitor for measurement into a digital signal, wherein the charge-balancing modulator is a first stage of a two-stage analogue-to-digital capacitance converter, FIG. 2 a block diagram of the two-stage capacitance converter, FIG. 3 a circuit diagram of the second stage of the converter of FIG. 2, wherein the conversion principle used is the same as in FIG. 1, FIG. 4 a circuit diagram of the converter of FIG. 3 consisting of the stage 1 of FIG. 1 and stage 2 of FIG. 3, FIGS. 5 and 6 time series of signals during operation of the converter of FIG. 4 and FIG. 7 an example of a design for an operational amplifier which is used in the circuit diagram of FIGS. 1 and 2.

FIG. 1 shows a circuit diagram of a charge-balancing modulator (hereafter abbreviated to CBM) for converting a capacitance into a digital signal. The CBM comprises an operational amplifier 1, the non-inverting input 2 of which is set on ground. The inverting input 3 is fed back to an output 4 of the operational amplifier 1 via an integration capacitor 5 which has a capacitance CI1. On the input side of the operational amplifier 1, a reference capacitor 6 is arranged which has a capacitance CR1 and is switched via changeover switches 7, 8 with its first input to either a first reference voltage input 9a, on which a first reference potential VR1a is provided, or a second reference voltage input 9b, on which a second reference potential VR1b is provided. The ground lies between the potentials VR1a and VR1b of the two reference voltages. The other input of the reference capacitor 6 is switched via the changeover switch 8 between ground and the inverting input 3 of the operational amplifier 1. The changeover switches 7 and 8 are controlled such that the reference capacitor 6 either lies between the second reference voltage input 9b and ground or is switched between the first reference voltage input 9a and the inverting input 3 of the operational amplifier 1.

A precision capacitor 10 represents a capacitance CS1 for measurement. The two connections of the precision capacitor 10 are connected to changeover switches 11 and 12 which switch one input to either the first (9a) or the second (9b) reference voltage input and the other input to either the ground or the inverting input 3 of the operational amplifier 1. The control of the changeover switches 11 and 12 is carried out such that the precision capacitor 10 either is charged by the reference potential VR1a (as it is then also set at the ground, it is charged by a reference voltage. This is the state shown in FIG. 1) or is switched between the input 9b and the inverting input 1 of the operational amplifier 1 (this state would be achieved in FIG. 1 after the changeover switches 11 and 12 have been thrown). The changeover switches 11 and 12 are controlled by a control line 13 which is energized by a clock input 14, wherein a clock signal N1 then contacts the control line 13 when a stop signal applied to a stop input 15 has a level which the clock signal N1 is allowed to pass at a logic gate 16, to the inputs of which the clock input 14 and the stop input 15 are connected and the output of which energizes the control line 13. The control line 13, i.e. the output of the logic gate 16 and thus the clock signal N1 contacting the stop input 15 at a suitable level, is fed to a clock input of the clocked comparator 17, the further input of which is connected to the output 4 of the operational amplifier 1. The output of the comparator 17 is set, together with the clock signal N1, on an AND gate 18, the output of which controls the changeover switches 7 and 8 as control line 19.

For compensation of a base capacitance, an additional capacitor 60 which provides a capacitance CZ1 is also provided at the input of the operational amplifier 1. One connection of the additional capacitor 60 is connected via a changeover switch 61 optionally to either the second reference potential VR1b at the reference voltage input 9b or the first reference potential VR1a at the first reference voltage input 9a. The other connection of the additional capacitor 60 is connected via a changeover switch 62 to either the ground or the inverting input 3 of the operational amplifier 1.

The control of the changeover switches is carried out such that the changeover switches 11, 12, 61, 62 controlled by the clock signal N1 have the position shown by continuous lines in FIG. 1 in a first half of the clock pulse and the reverse position in the other half of the clock signal.

The additional capacitor 60 serves to subtract a base capacitance of the precision capacitor 10, with the result that the capacitance CZ1 defines the lower limit of the measured value of the capacitance for measurement. This will be explained later.

The structure of FIG. 1 corresponds, in this respect, to a known converter according to the charge balance principle. At a counting output 20, it emits pulses, the number of which in relationship to the number of pulses of the clock signal N1 is a measure of the capacitance CS1 of the precision capacitor 10, if the integration capacitor 5 was discharged at the start of the counting. For this, a switch 22 for bypassing the integration capacitor 5 is provided in the feedback branch of the operational amplifier 1, which switch can be closed in a controlled manner via a return input 21, in order to discharge the integration capacitor 5 and thus to achieve the suitable conditioning for the conversion.

Differing from known CBMs, the output 4 of the operational amplifier 1 is connected to a residual voltage output 23, and the stop input 15 allows the clock signal N1 applied to the clock input 14 to be blocked. The clock input 14, the stop input 15 and the logic gate 16 implement, in combination with the return input 21 and the switch 22, a start-stop circuit which makes possible a return of the integration capacitor 5 on the one hand and a pausing of the conversion on the other hand, for example after a particular number of steps of the clock signal N1. If the conversion has been paused, a residual voltage VA1 contacts the residual voltage output 23, which residual voltage represents the charge which is stored at the integration capacitor 5.

Figure 2:
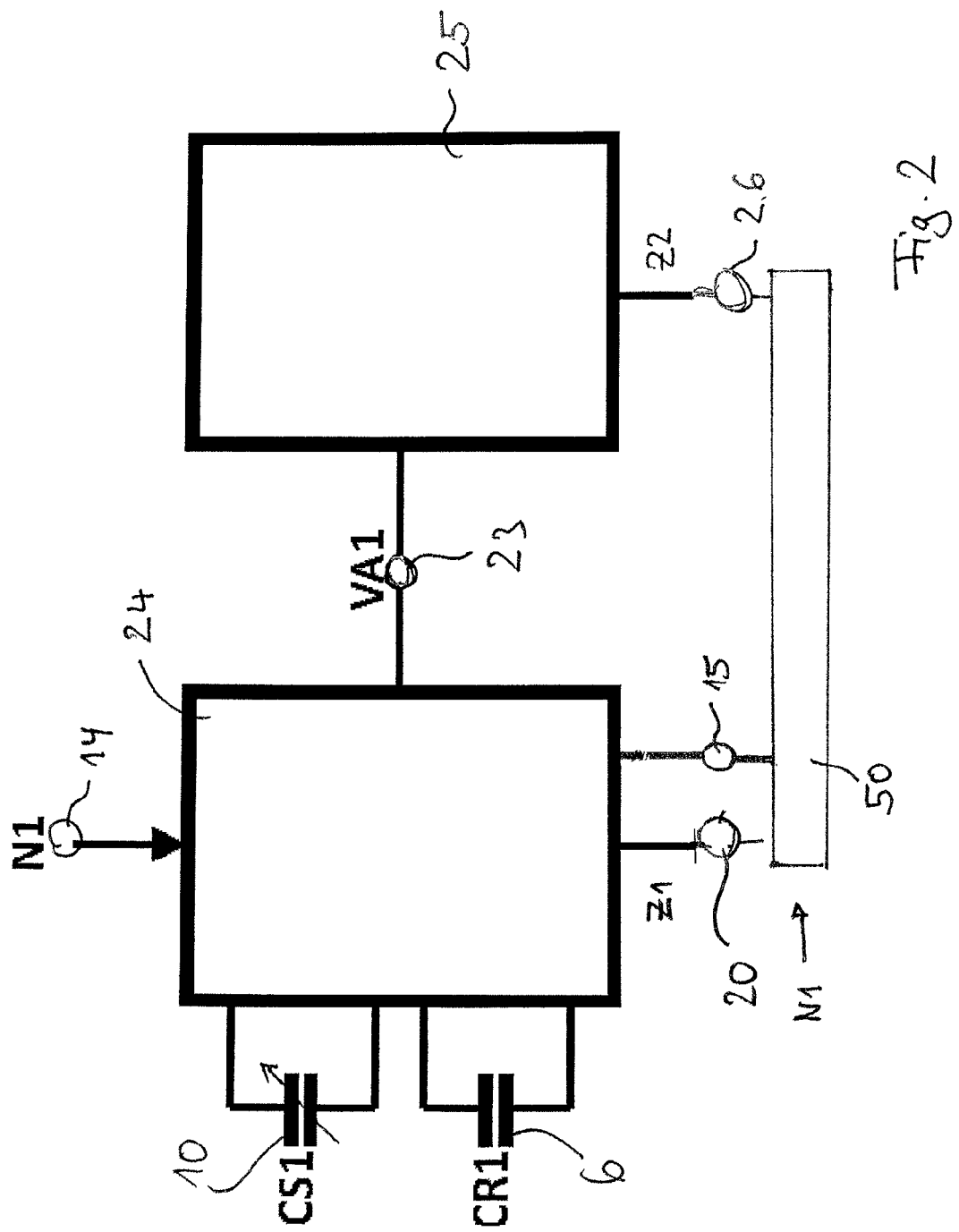

As the block diagram of FIG. 2 shows, the residual voltage VA1, which contacts the residual voltage output 23, is converted with an analogue-to-digital voltage converter 25 after the CBM 24 has been paused. FIG. 2 shows the CBM 24 of FIG. 1 as a block diagram. The clock input 14 for the clock signal N1, the stop input 15, the precision capacitor 10, the reference capacitor 6 as well as the counting output 20, which the count pulses Z1 contact, are additionally represented schematically. An analogue-to-digital converter 25 taps the residual voltage VA1 at the residual voltage output 23 of the CBM 24, converts the voltage into a digital value and emits this in the form of count pulses Z2 at a counting output 26. The counting outputs 20 and 26 are evaluated by a counting circuit 50 which also contains the clock signal N1 and controls the stop input 15 in order to end phase 1 after a predetermined number of clock pulses of the clock signal N1. It obtains high-order bits of the digital total result from the count pulses Z1 provided by CBM 24 at the counting output 20 and low-order bits of the digital total result from the count pulses Z2 provided by the A/D converter 25 at the counting output 26.

Figure 3:
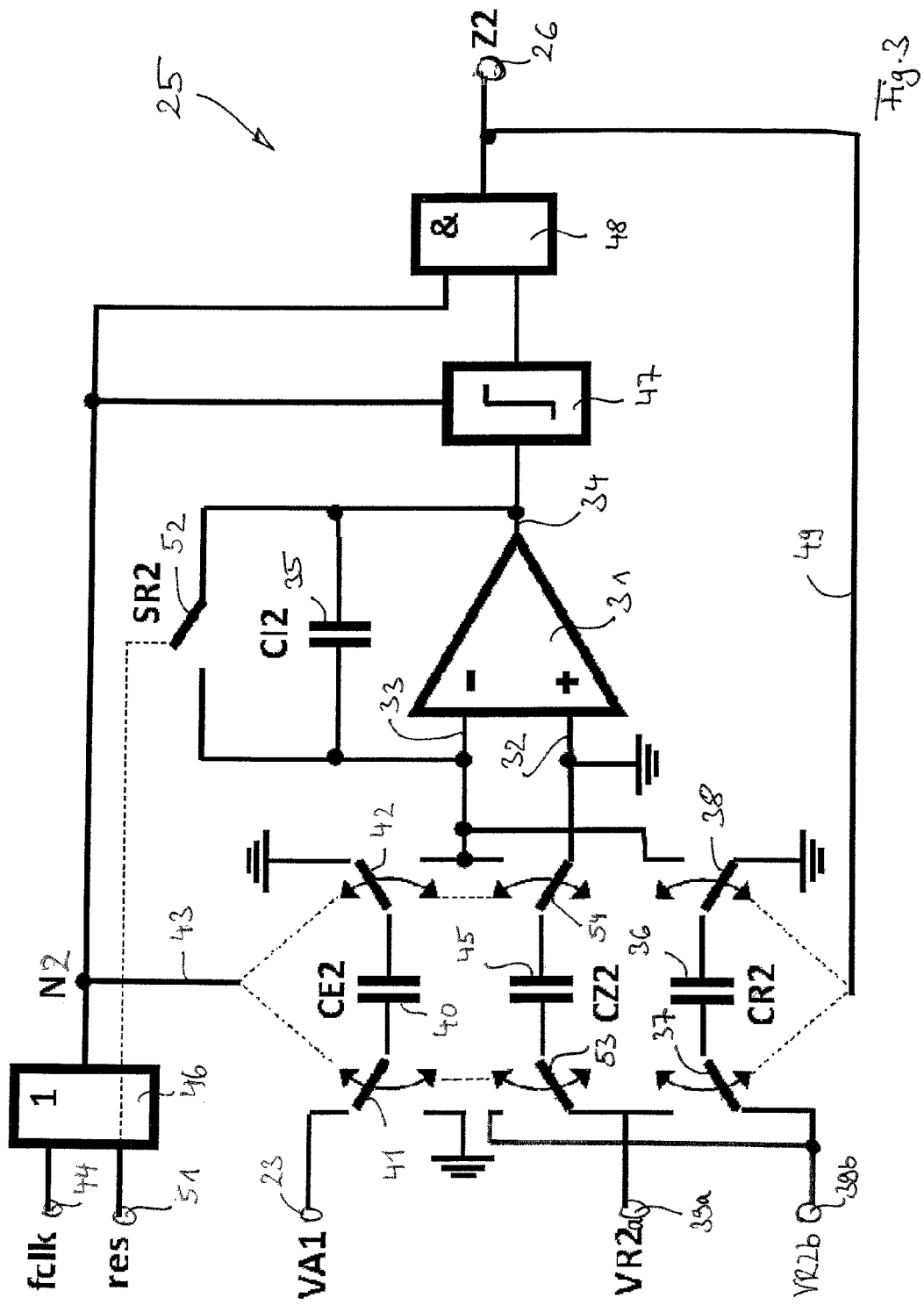

In a particularly preferred embodiment, the A/D converter 25 is likewise constructed as a circuit according to the charge balance method. FIG. 3 shows an example of a circuit diagram, wherein elements which correspond functionally or structurally to those of FIG. 1 have been provided with reference numbers that are higher by 30. An operational amplifier 31 in FIG. 3 thus corresponds in terms of function and structure to the operational amplifier 1 of FIG. 1, etc. As a result, for FIG. 3 reference is made in this respect to the description of FIG. 1.

The A/D converter 25 of FIG. 3 differs from the CBM 24 of FIG. 1 essentially in the following three aspects:

1. The start-stop circuit is not designed to pause the clock pulse. It is also not necessary for a residual voltage to be provided, which would have to be converted otherwise. Rather, the A/D converter 25 converts the voltage VA1 completely into a digital value.
2. The A/D converter 25 does not convert an unknown capacitance (precision capacitor 10 with capacitance CS1), but an unknown voltage VA1 which is available at the residual voltage output 23 of the CBM 24. It therefore has an input capacitor 40 at the point at which the CBM 24 of FIG. 1 has the precision capacitor 10. The input capacitor 40 has a known capacitance CE2, as this is necessary to convert the unknown voltage VA1 (in the CBM 24 of FIG. 1, in contrast, the reference voltages VR1a and VR1b are known).
3. Parallel to the reference capacitor 36 and the input capacitor 40, in the A/D converter 25 there is also an offset capacitor 45 which is switched over in a clocked manner via changeover switches 53, 54 with one of its inputs between ground of a further first (VR2a) and second (VR2b) reference voltages (at reference voltage inputs 39a and 39b) and the other of its inputs between the ground and the inverting input 33 of the operational amplifier 31. The offset capacitor 40 allows compensation of an alternating sign of the voltage VA1, which can be positive or negative.

The charge-balancing modulator of the A/D converter 25 comprises the switched capacitances CE2, CZ2 and CR2, the integrator consisting of operational amplifier 31 and integration capacitor 35, the return switch 52 and the clocked comparator 47. The input capacitor 40 samples, controlled by the clock pulse sequence N2, the output voltage VA1 of the CBM 24 located in the hold mode, the capacitor 45, likewise controlled by the clock pulse sequence N2, samples the difference of the reference potential (VR2b–VR2a), and the capacitor 36, controlled by the pulse sequences Z2, samples the difference of the reference potential (VR2a–VR2b). The regulation loop in turn forces the compensated charge balance, with the result that the number of output pulses Z2 of the A/D converter 25 for a number of N2 clocked pulses results as follows:

$$N2*CE2*VA1-Z2*CR2*(VR2a-VR2b)+N2*CZ2*(VR2a-VR2b)=0$$

$$Z2=N2*[VA1*CE2/((VR2a-VR2b)*CR)]+CZ2/CR2.$$

The capacitance CZ2=CR2/2 serves to shift the zero point of the A/D converter 25, which can thereby process the bipolar voltage delivered by the CBM 24 relative to the ground. Z2 is a digital representation of the voltage VA1 and is evaluated by the counting circuit 50.

The size of the capacitances and their relationships are to be defined taking into consideration the variation range of the sensor capacitance, the dynamic ranges of the operational amplifiers and the precise adaptation of the input voltage range of the second modulator to the output voltage range of the first modulator. Optimum values are satisfied with the following dimensioning:

$$CR1=CS1\_max$$

$$CI1>2*CR1$$

Here, CS1_max stands for the upper limit of the measurement range for the capacitance of the precision capacitor if the measurement range starts at 0. CE2 and CZ2 are determined with the choice of CR2 according to the rules that are usual for switched-capacitor circuits $$CZ2=CR2/2,$$

$$CE2=0.5*CI1*CR2/CR1,$$

in order to achieve an optimum compromise between an error due to charge injection of the CMOS switch, a capacitance error and an error due to settling of the RC elements.

The exact value of CI2 is not critical. To prevent overload, CI2>2*CR2 should apply.

Under these prerequisites, the total result of the conversion results as Z=(Z1−1)*N2/2+Z2, with a total resolution of (N1*N2/2) steps or $\log_2$(N1*N2/2) bits. Although a configuration of the numbers of clocked pulses N1 and N2 as powers of 2 with regard to their further processing by the counting circuit 50 by means of simple counters and decoders is advantageous, such a design is optional. In an embodiment, the determination of the final result Z of the conversion is preferably brought about by a microcontroller according to the above-mentioned calculation rule. This also provides maximum flexibility with respect to the choice of N1 and N2.

The calculation may be explained using the following example:

A sensor capacitance which varies in the range of from 1 pF to 8 pF is to be evaluated. The required precision is 0.05%. In order to provide sufficient play for tolerances, the A/D capacitance converter is to cover a capacitance range of from 0 to 10 pF with a minimum resolution of 2 fF and the result is to be emitted in a binary format for reasons of compatibility. This requirement is to be met with a 13 bit converter. The capacitance resolution then corresponds to 10 pF/8192=1.22 fF. The shortest conversion time when the charge balance method is used in both phases is achieved in the case of a division into a 7 bit conversion in phase 1 and a 7 bit conversion in phase 2, of which 7 bits are useful. This requires a number of clocked pulses N1=N2=128, i.e. a total of 256 clock pulses, in both phases. From the count results Z1 and Z2 of both phases, the total result $$Z=(Z1-1)*64+Z2$$

is then calculated e.g. by a µC and can then be made available for further use in an at least 13-digit, binary number representation. The sought capacitance value results as $$CS=CR1*Z/8192,$$

wherein CR1 in this case is 10 pF and all other capacitances are chosen accordingly following the dimensioning specification mentioned here.

In modern mixed-signal CMOS processes, a clock frequency of 2 MHz is applicable problem-free for capacitances in the named order of magnitude, which results in a conversion time of 128 µs. In the case of a single-phase conversion, in contrast, the conversion would require 4,096 ms.

A design usual in digital capacitance meters is a measurement range of 2,000 or 4,000 steps. Such a design is possible e.g. if N1=100 and N2=40 or 80 is chosen. At full scale Z1=N1 and Z2=N2/2 and thus the total fs result $$Z=(100-1)*20+20=2,000 \text{ or } (100-1)*40+40=4,000$$

is [ . . . ].

If another A/D converter method is used in the second phase, which provides the result directly in binary code, this result represents the number Z2, which is further converted as described together with Z1 into the total result Z. For N2, $2^k$ is then to be used, wherein k is the bit resolution of the ADC 25.

Preferably, during phase 1 of the conversion the A/D converter 25 is not clocked and is in the returned state, whereas in phase 2 the CBM 24 is not clocked and is located in the hold mode.

An advantageous design is to use the capacitance CR1 not needed in phase 2 in the CBM 24 as capacitance CR2 in the A/D converter 25. In addition to the saving in terms of chip area, a better matching of the capacitance ratios that are important for the precision can also be achieved thereby.

An acceleration can optionally be achieved by providing the operational amplifier 1, the integration capacitor 5 and the switch 22, which together implement a hold function and the discharging of CI1 before the renewed start, twice and using them in turns over time for the integration function or the hold function. For this, an additional control clock pulse is used which controls the following functions:

connecting the output 23 to the output of that one of the two operational amplifiers which is currently carrying out the hold function;

to guide the return pulse onto that one of the discharge switches the operational amplifier of which is carrying out the integration next;

switching the switches 8 and 12 during the clocking thereof from the ground to the negative input of that one of the two operational amplifiers which is currently carrying out the integration.

The following A/D voltage converter 25 thus converts the residual voltages VA1 of both hold circuits which are a constituent of the CBM 24 in turns. This implementation is particularly advantageous when the numbers of clock pulses N1 and N2 are identical in the two phases.

In this case, which also provides the shortest response time, this pipeline principle doubles the sampling rate.

Depending on the design, in the case of many capacitive sensors there is a base capacitance, with the result that, for the variable part of the sensor capacitance, only a fraction of the resolution is available. Such base capacitances are as a rule inevitable in the case of capacitive sensors and would result in the resolution of the whole circuit being "consumed" unnecessarily by base values of the capacitance of the precision capacitor, as the measurement range would have to be designed unnecessarily large. A typical example of this are humidity sensors in which fixed and variable proportions are in a ratio of approx. 10:1. It is therefore provided in the embodiment shown in FIG. 1 to shift the capacitance measurement range for the precision capacitor 10 by using, analogously to the circuit according to FIG. 3, an offset capacitor 60 with a capacitance CZ1=CSmin also in the CBM 24, which capacitance is included in the charge balance such that the total resolution results in the resultant measurement range CSmin to CSmax. Thus $$N1*CS1*(VR1a-VR1b)-Z1*CR1*(VR1a-VR1b)- \\ N1*CZ1*(VR1a-VR1b)=0$$

$$Z1=N1*(CS1-CZ1)/CR1, \text{ with } CZ1 \leq CS1 \leq CR1$$

The offset capacitor 60 and the changeover switches 61, 62 can, naturally, be dispensed with if no base capacitance is to be taken into consideration.

Figure 4:
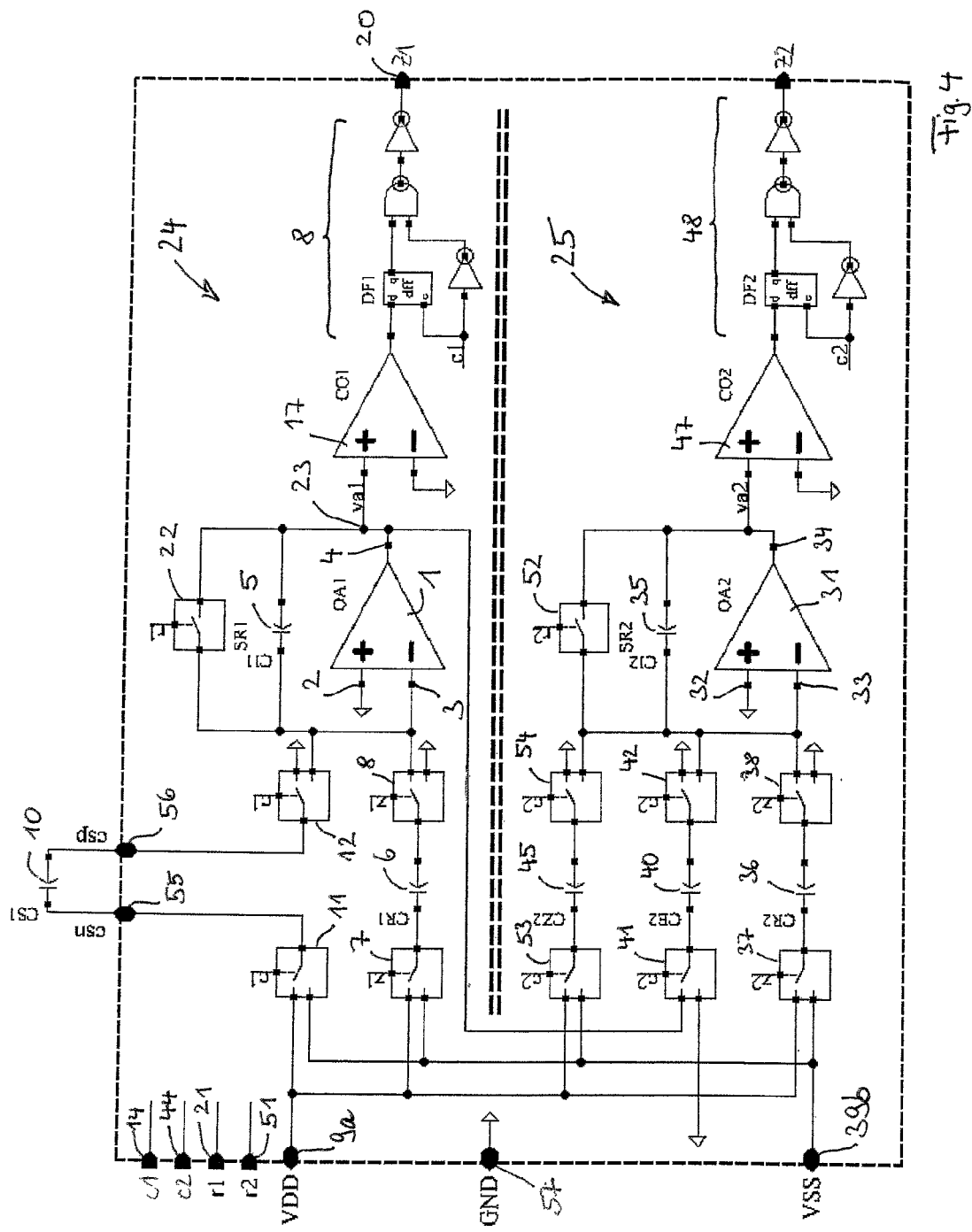

A possible circuit arrangement of both stages of the analogue-to-digital capacitance converter is shown in FIG. 4 (but without the offset capacitor here). The clock diagrams in FIGS. 5 and 6 serve to illustrate the procedure.

In FIG. 4 the reference numbers of FIGS. 1 and 3 are taken up again, with the result that there is no need to repeat the description of the corresponding components. It may also be noted that FIG. 4 does not contain the optional design with offset capacitor in the CBM 24.

As the reference potentials only have a ratiometric function, but are not included with their absolute value in the conversion result, a simplification of the system architecture is achieved if the operating voltage VDD is used for the first reference potential VR1a and VR2a. 39b is a negative operating voltage connection at which a negative operating voltage VSS is supplied as second reference potentials VR1b and VR2b. The potential GND preferably lies approximately in the centre between VDD and VSS and acts as ground. The effective reference voltage is the potential difference which is sampled when the "left-hand side" (FIGS. 1 and 3) switches are switched over, irrespective of the position of the potentials (if these lie within the operating voltage limits). The use of VDD and VSS is an advantageous choice, as these voltage sources are inherently resilient and additional buffers need not be provided in order to absorb spikes during the charging of the capacitances.

The clock pulse c1 and the return signal r1 control the CBM 24, c2 and c2 control the A/D converter 25. c1 and c2 correspond to N1 and N2 in FIGS. 1/3. The precision capacitor 10 for measurement is connected to the terminals 55 and 56. It is not a constituent of the converter.

The pulse sequences at Z1 and Z2 are the output signals of the circuit which are converted by means of the counting circuit 50 (e.g. by counters and decoders or in a microcontroller) into the desired form of the digital number representation.

Figure 5:
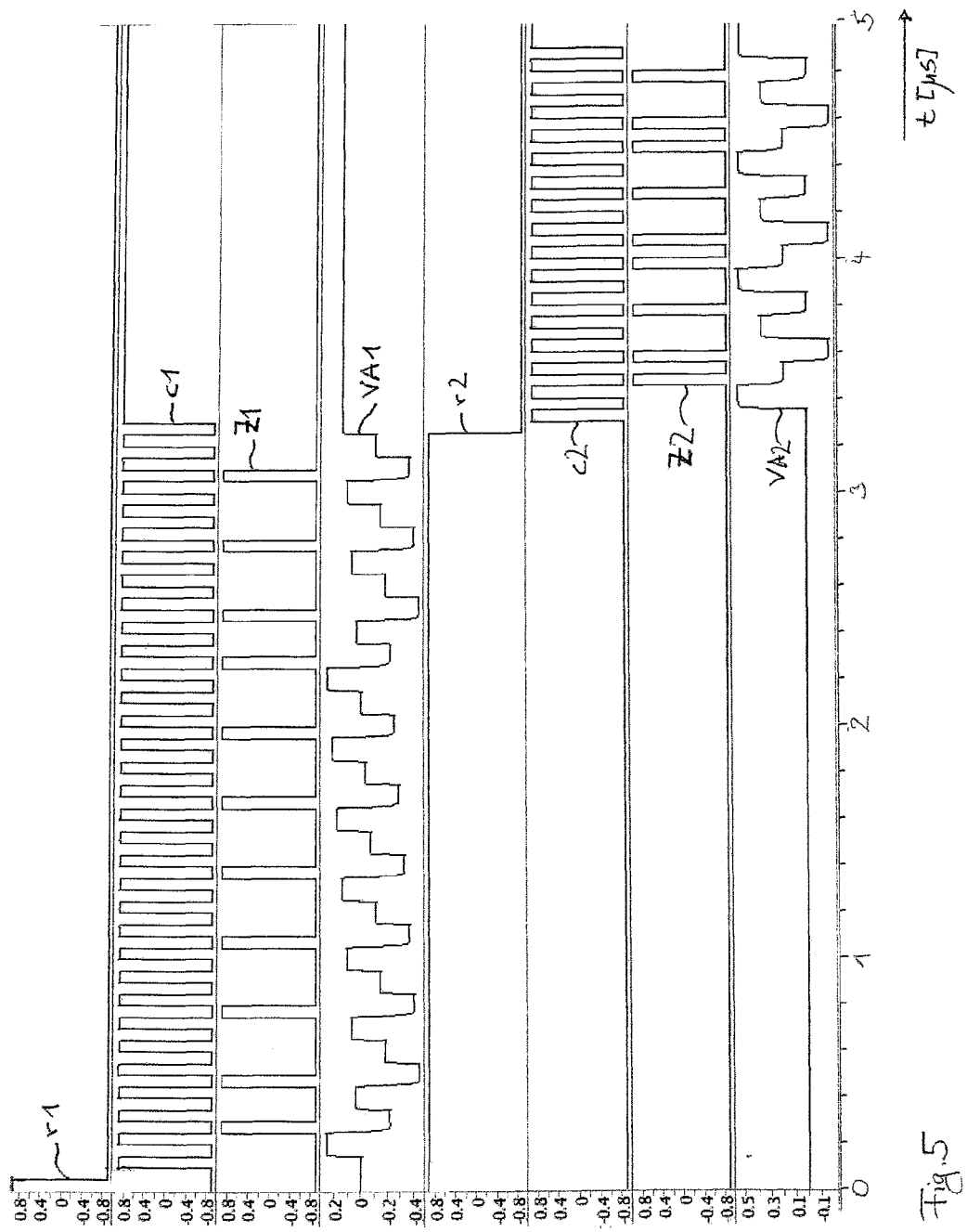
Figure 6:
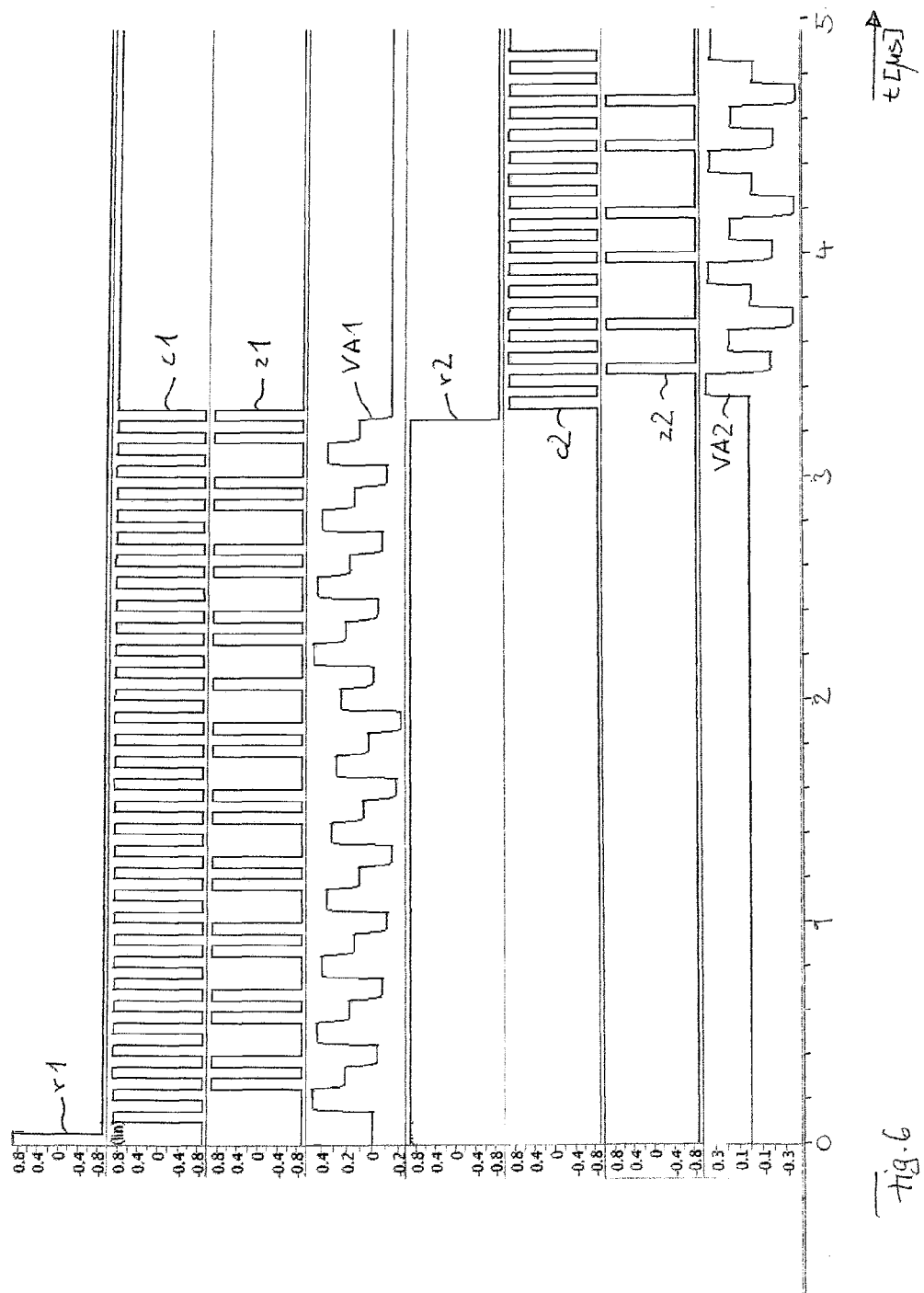

FIGS. 4 and 5 show the time sequence of eight signals during a digital conversion of a capacitance of a precision capacitor. From top to bottom in FIGS. 5 and 6, the following variables are plotted: r1 (return signal for closing the switch 22), c1 (clock signal at the clock signal input 14, corresponding to the clock pulse N1), Z1 (count pulses at the counting output 20), VA1 (residual voltage at the residual voltage output 23), r2 (return signal at the return input 51), c2 (corresponding to N2), Z2 (count pulses at the counting output 26), VA2 (voltage at the output 34 of the operational amplifier 31). All signals are plotted linearly over time. The signal at the stop input 15, which is set to zero at time point, where the clock c1 is stopped, i.e. at the start of the time series of FIGS. 5 and 6, is not plotted.

The clock diagram of FIG. 5 shows the example of an 8 bit capacitance-to-digital conversion in 48 clock pulses with the circuit of FIG. 4. In phase 1, starting from the returned state of the first integrator 32, charge packets CS1*(VDD−VSS) are integrated. If the starting voltage of the integrator VA1 exceeds the comparator threshold, in the subsequent clock pulse a charge packet CR1*(VDD−VSS) is extracted from the integration capacitor and simultaneously a clocked pulse is emitted as Z1 via the combination of D flip-flop and gate circuit at 20. As can be seen, the voltage VA1 moves constantly around the ground GND. The different signs of the charge during sampling of the same voltage VDD are achieved by the opposite phase position of the control clock pulses of the pair of three-way switches 11, 12 or 7, 8. The arrangement of these switches used is usual in switched-capacitor technology and simultaneously has the advantage that parasitic capacitances at both terminals of all capacitors, including the precision capacitor 10, are not included in the measurement result.

During the whole of phase 1, the integrator of the A/D converter 25 is located in the returned state. Phase 1 ends with the last clocked pulse at c1, wherein the residual voltage VA1 retains its value at the end of phase 1, as the return signal r1 furthermore remains on low, thus the switch 22 is not closed.

With the transition of the return signal r2 from a high to a low level and the start of the clock pulse sequence c2, the A/D converter 25 now operates in the same way as the CBM 24 previously, with the difference that the charge packets for integration CR2*VA2 are now formed by the known capacitance CR2 and the residual voltage VA1 for measurement. The pulses Z2 produced during phase 2 are available at 26.

Optionally, it is possible to implement CR1 and CR2 by a single capacitor. However, this is only meaningful if relatively small sensor capacitances are to be measured, as otherwise the requirement for high capacitance values of CR1 and CI1 would automatically be transferred to the values of CZ2 and CI2, which entails a significant increase in the layout surface area and the power requirement in the A/D converter 25.

The circuit according to FIG. 4 can be used without amendments to its structure for any combinations of the numbers of clocked pulses in phase 1 and phase 2, i.e. resolution and conversion time can be adapted to the requirements by the digital control signals alone. The maximum speed with a predefined resolution and clocked A/D conversion is achieved if the resolution is distributed uniformly to both phases. Reasons for extending phase 1 can be e.g. a greater robustness against coupled-in interferences, as the measurement of the precision capacitor during this phase is carried out with an integrating nature. This converter is thus ideally suitable as an IP block in mixed-signal ICs.

FIGS. 5 and 6 show, by way of example, the results of an 8 bit conversion of a sensor capacitance of 0.7 pF (FIG. 5) and 1.3 pF (FIG. 6). The following capacitance values were used: CR1=2 pF, CI1=5 pF, CR2=0.4 pF, CZ2=0.2 pF, CE2=0.5 pF, CI2=0.8 pF, which can be designed made of units of identical layouts of 0.1 pF. The measurable capacitance range thus results at 0 to 2 pF in a resolution of Clsb=78.125 fF (2 pF/256). If the above-mentioned relationship is applied, the following result for the examples in FIG. 5 and FIG. 6: CS1=89*Clsb=0.6953 pF or CS1=160*Clsb=1.2969 pF.

The following optional development relates to component errors in the CBM 24. It comprises the three-way switches 58, 59 and the crossed wiring of the integration capacitor 5. The development addresses the following problem:

The charge-balancing modulator according to FIG. 1 is therefore suitable above all for the integration, because it only makes small demands on the precision of the individual components. No-load operation amplification of the operational amplifier 1 and offset voltage of the comparator 17 can fluctuate within broad limits without endangering the monotonicity of the characteristic or generating so-called missing codes. If used as A/D voltage converter, the offset voltage of the operational amplifier is of secondary importance, as by including an auto-zero conversion in which the input is short-circuited the offset on the digital side can be eliminated by subtraction of the auto-zero result. If used as A/D capacitance converter 24, this is not possible, as a "zero capacitance" cannot be implemented. The offset of the operational amplifier 1 therefore limits the total precision in the CBM 24 in some cases and can result in missing codes. The influence of the offset voltage of the operational amplifier 1 and also that of leakage currents of the switches 8, 12, which are connected to the negative input 3 of the operational amplifier 1, is eliminated as far as possible in the development by exchanging the directions of discharging and charging processes which produce the charge balance. For this, after e.g. half of the clock pulses of the clock signal N1:

the terminals of the integration capacitor 5 are reversed by the switches 58 and 59 (dotted position in FIG. 1), the switches 11 and 7 are controlled with a clock signal inverted related to the first half of phase 1, with the result that the capacitor 10 produces a downwards integration and the capacitor 6 produces an upwards integration of the output voltage of the operational amplifier, and the comparator 17 is controlled together with the logic circuit 16 such that in the case of a fall below the comparator threshold (instead of when it is exceeded) the clocked pulses pass through the gate circuit and produce starting pulses Z1 at 20.

In this way, the influence of the offset voltage is compensated for in the two halves of phase 1 without altering the result Z1. Naturally, care must be taken that the integration capacitor 5 has the same polarity again at the end of phase 1 as at the start of conversion. It is possible to carry out the pole-reversing process several times during phase 1, wherein the sum of all clock pulses of the positive parts of phase 1 is equal to the sum of all clock pulses of the negative parts. In addition, a certain suppression of lower-frequency noise can thus be achieved comparably with a chopper amplifier. As, however, the proposed pole-reversing technology can produce even slight errors, e.g. by reloading the parasitic capacitances on both sides of CI1, an alternation in the integration direction that is too frequent, e.g. more than 10 times, is not preferred, but is nevertheless possible. This development is also possible for the A/D voltage converter if the latter operates according to the charge balance method.

Figure 7:
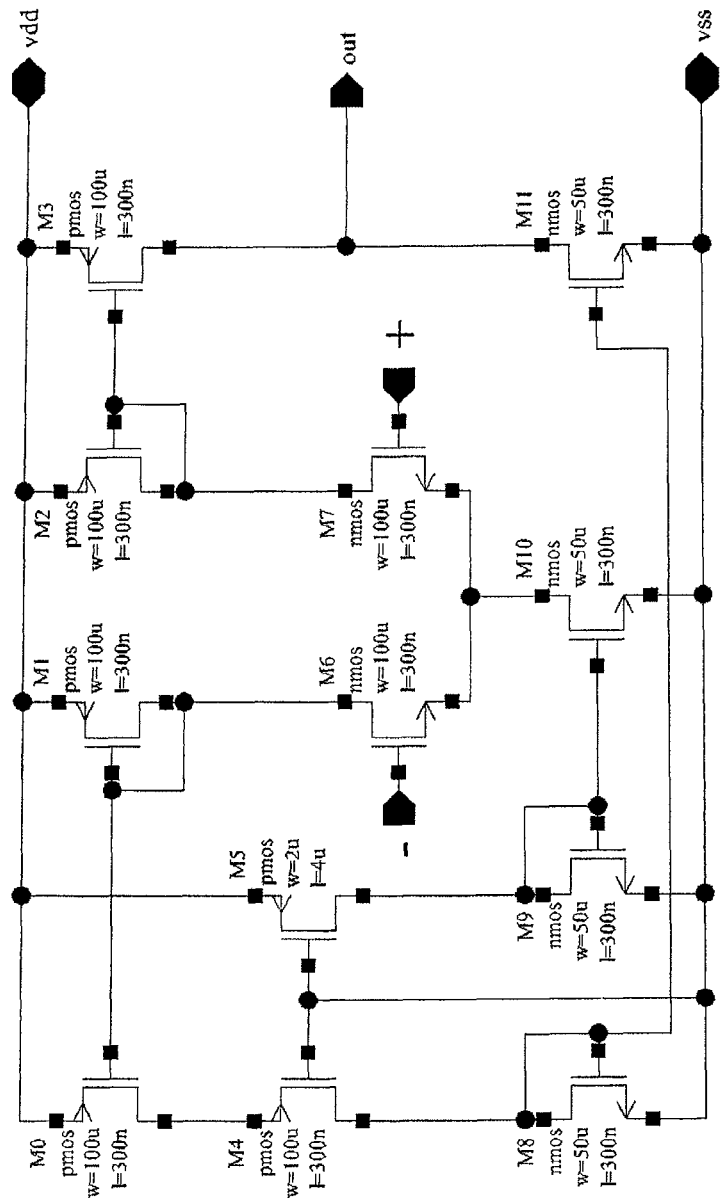

FIG. 7 shows schematically a circuit for implementing the operational amplifier 1 and/or 31. It consists of 12 MOSFET transistors M0 to M11. The corresponding parameters of the structure width and length are entered in the drawing, wherein "u" stands for the unit micrometer and "n" for the unit nanometer. vdd is the positive supply voltage VDD, vss is the negative supply voltage VSS, "−" denotes the inverting input and "+" the non-inverting input. The output of the operational amplifier is labelled "out".

LIST OF REFERENCE NUMBERS 1, 31 operational amplifier
2, 32 non-inverting input
3, 33 inverting input
4, 34 output
5, 35 integration capacitor
6, 36 reference capacitor
7, 8, 37, 38 changeover switch
9, 39 reference voltage input
10 precision capacitor
11, 12, 41, 42 changeover switch
13, 43 control line
14, 44 clock input
15 stop input
16, 46 logic gate
17, 47 comparator
18, 48 AND gate
19, 49 control line
20 counting output 1
21, 51 return input
22, 52 switch
23 residual voltage output
24 CBM
25 A/D converter
26 counting output 21
40 input capacitor
45, 60 offset capacitor
50 counting circuit
53, 54 changeover switch
55, 56 connection for precision capacitor
57 ground
58, 59 three-way switch
61, 62 changeover switch

The invention claimed is:

1. An analog-to-digital capacitance converter for converting a capacitance of a sensing capacitor to be measured into a digital signal, the converter comprising:
   a charge-balancing modulator, comprising:
      an operational amplifier including an output, an inverting input and a non-inverting input, wherein an integrating capacitor is connected between the inverting input and the output, and wherein the non-inverting input is connected to a neutral reference potential;
      a reference capacitor, including a first electrode and a second electrode, wherein the first electrode is connected via a first changeover switch selectively to either a first reference potential or a second reference potential, and wherein the second electrode of which is connected via a second changeover switch selectively to either the neutral reference potential or the inverting input of the operational amplifier;
      two terminals for the sensing capacitor, wherein one of the two terminals is connected via a third changeover switch selectively to either the first reference potential or the second reference potential and the other of the two terminals is connected via a fourth changeover switch to either the neutral reference potential or the inverting input of the operational amplifier;
      a clocked comparator coupled to the output of the operational amplifier, to a logic gate, to a clock generator for controlling a plurality of changeover switches, and a counting output for emitting a counting signal; and
   a start-stop circuit to short-circuit the integrating capacitor before a start of conversion and to pause the clock generator after a predetermined number of cycles;
   an analog-to-digital voltage converter, an input of which is connected to the output of the operational amplifier of the charge-balancing modulator and which is connected to the start-stop circuit such that after the clock generator has been paused the analog-to-digital voltage converter converts a residual voltage present at the output of the operational amplifier of the charge-balancing modulator into a value and emits the value at an output; and
   a counting circuit which is connected to the clock generator, the counting output of the charge-balancing modulator and the output of the analog-to-digital voltage converter, and which combines the counting signal delivered by the charge-balancing modulator with the value emitted by the analog-to-digital voltage converter to form a total result, wherein the counting circuit defines least significant bits of the total result on the basis of the value emitted by the analog-to-digital voltage converter and most significant bits of the total result on the basis of the counting signal.

2. An analog-to-digital capacitance converter according to claim 1, wherein the charge-balancing modulator includes an additional capacitor, wherein a first electrode of the additional capacitor is connected via a changeover switch selectively to either the first reference potential or the second reference potential, and a second electrode of the additional capacitor is connected via a changeover switch selectively to either the neutral reference potential or the inverting input of the operational amplifier, wherein the clock generator also controls the changeover switches switching over the first and second electrodes of the additional capacitor.

3. An analog-to-digital capacitance converter according to claim 1, wherein the start-stop circuit is configured to pause the clock generator of the charge-balancing modulator after a predetermined number of cycles which corresponds to a resolution of k bits, and the analog-to-digital voltage converter is configured to convert the residual voltage into the value, which has m bits, whereby a digital total result has a resolution of p=k+(m−1) bits, wherein k is greater than or equal to 0.5*p.

4. An analog-to-digital capacitance converter according to claim 1, wherein the output of the operational amplifier of the charge-balancing modulator, which delivers the residual voltage, is connected to a storage element which buffers the residual voltage, and wherein the start-stop circuit, after the voltage has been stored, short-circuits the integrating capacitor of the charge-balancing modulator and sets the clock generator of the charge-balancing modulator into operation again for a new conversion, while the analog-to-digital voltage converter converts the residual voltage stored in the storage element.

5. An analog-to-digital capacitance converter according to claim 1, wherein the analog-to-digital voltage converter comprises:
   an operational amplifier, including coupled between an output and an inverting input of the operational amplifier is an integrating capacitor, and including a non-inverting input to which the neutral reference potential is connected;
   a reference capacitor, a first electrode of the reference capacitor is connected via a first changeover switch selectively to either a further first reference potential or the ground and the second electrode of the reference capacitor is connected via a second changeover switch selectively to either the neutral reference potential or the inverting input of the operational amplifier;
   an input capacitor, one electrode of the input capacitor is connected via a third changeover switch to either the potential of the residual voltage or the neutral reference potential, and the other electrode of the input capacitor is connected via a fourth changeover switch selectively to either the neutral reference potential or the inverting input of the operational amplifier;

a clocked comparator connected to the output of the operational amplifier as well as to the logic gate and the clock generator to controlling the plurality of changeover switches; and an offset capacitor, one electrode of the offset capacitor is connected via a fifth changeover switch selectively to either the further first reference potential or a further second reference potential, and the other electrode of the offset capacitor is connected via a sixth changeover switch selectively to either the neutral reference potential or the inverting input of the operational amplifier, wherein the clock generator also controls the fifth and sixth changeover switches;

wherein the counting circuit for determining the value emitted by the analog-to-digital voltage converter counts the pulses delivered by the logic gate of the analog-to-digital voltage converter and uses this count as the value.

6. An analog-to-digital capacitance converter according to claim 5, wherein the following relationship applies: $CR1=CSmax$, $CI1>2*CR1$, $CZ2=0.5*CR2$ and $CE2=0.5*CI1*CR2/CR1$, wherein CSmax is the maximum allowable capacitance of the sensing capacitor for measurement, CR1 is the capacitance of the reference capacitor of the charge-balancing modulator, CI1 is the capacitance of the integrating capacitor of the charge-balancing modulator, CE2 is the capacitance of the input capacitor of the analog-to-digital voltage converter, CR2 is the capacitance of the reference capacitor of the analog-to-digital voltage converter and CZ2 is the capacitance of the offset capacitor of the analog-to-digital voltage converter.

7. An analog-to-digital capacitance converter according to claim 6, wherein the following relationship applies: $CI2>2*CR2$, wherein CI2 is the capacitance of the integrating capacitor of the analog-to-digital voltage converter.

8. An analog-to-digital capacitance converter according to claim 6, wherein a positive supply voltage acts as the first reference potential and as the further first reference potential, and a negative supply voltage acts as the second reference potential and as the further second reference potential.

9. A method for converting a capacitance of a sensing capacitor to be measured into a digital signal, the method comprising:

charging an integrating capacitor, which is discharged before starting the conversion, and which is disposed in an integrator circuit, in a clocked charging processes by an electric current which is obtained from a charge of a sensing capacitor and is discharged in discharge processes by brief current pulses of opposite direction, wherein the current pulses are obtained from a charge of a reference capacitor, such that on average no charge builds up in the integrating capacitor;

counting the number of discharge processes occurring during a particular number of clock pulses;

pausing the clocked charging process after a predetermined number of cycles;

converting a residual voltage which the integrator circuit emits due to a residual charge of the integrating capacitor into a value by means of analog-to-digital voltage conversion; and combining the counted number of discharge processes and the particular number of clock pulses with the value delivered by the analog-to-digital voltage converter to form a digital total result, the total result comprising a least significant bit and a most significant bit, wherein least significant bits of the total result are defined on the basis of the value delivered by the analog-to-digital voltage converter and most significant bits of the total result are defined on the basis of the counted number of discharge processes and the particular number of clock pulses.

* * * * *